United States Patent
Radovanov et al.

(10) Patent No.: US 9,297,063 B2
(45) Date of Patent: Mar. 29, 2016

(54) PLASMA POTENTIAL MODULATED ION IMPLANTATION SYSTEM

(75) Inventors: Svetlana B. Radovanov, Brookline, MA (US); Victor M. Benveniste, Lyle, WA (US); Bon-Woong Koo, Andover, MA (US); Richard M. White, Newmarket, NH (US); Kevin M. Daniels, Lynnfield, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 687 days.

(21) Appl. No.: 13/457,451

(22) Filed: Apr. 26, 2012

(65) Prior Publication Data

US 2013/0287964 A1 Oct. 31, 2013

(51) Int. Cl.
| | |
|---|---|
| H01J 37/317 | (2006.01) |
| H01J 37/16 | (2006.01) |
| C23C 14/48 | (2006.01) |
| C23C 16/04 | (2006.01) |
| H01J 37/32 | (2006.01) |

(52) U.S. Cl.
CPC .............. *C23C 14/48* (2013.01); *C23C 16/042* (2013.01); *H01J 37/3171* (2013.01); *H01J 37/32357* (2013.01); *H01J 37/32422* (2013.01); *H01J 37/32623* (2013.01); *H01J 2237/083* (2013.01); *H01J 2237/0817* (2013.01)

(58) Field of Classification Search
CPC .... C23C 14/48; C23C 14/042; C23C 16/042; H01J 37/3171; H01J 37/32422; H01J 27/024; H01J 2237/31711; H01J 37/09; H01J 37/32357; H01J 37/32623; H01J 2237/0817; H01J 2237/083; H01L 21/266
See application file for complete search history.

(56) References Cited

U.S. PATENT DOCUMENTS

| | | | | |
|---|---|---|---|---|
| 4,523,971 | A * | 6/1985 | Cuomo et al. | 156/345.39 |
| 4,911,814 | A * | 3/1990 | Matsuoka | C23C 14/357 |
| | | | | 204/192.12 |
| 5,453,305 | A * | 9/1995 | Lee | B01J 19/126 |
| | | | | 118/723 MA |
| 6,759,807 | B2 * | 7/2004 | Wåhlin | H01J 27/024 |
| | | | | 313/361.1 |
| 7,034,285 | B2 * | 4/2006 | Ichiki | H05H 1/46 |
| | | | | 250/251 |
| 7,564,042 | B2 | 7/2009 | Lee et al. | |
| 7,767,561 | B2 | 8/2010 | Hanawa et al. | |

(Continued)

FOREIGN PATENT DOCUMENTS

WO 2010040805 A1 4/2010

OTHER PUBLICATIONS

Leavitt, Christopher J., et al., Apparatus and Method for Maskless Patterned Implantation, U.S. Appl. No. 13/046,39, filed Mar. 11, 2011.

(Continued)

*Primary Examiner* — Brooke Purinton

(57) ABSTRACT

An ion implantation system including a plasma source, a mask-slit, and a plasma chamber. The plasma source is configured to generate a plasma within the plasma chamber in response to the introduction of a gas therein. The mask-slit is electrically isolated from the plasma chamber. A positive voltage bias is applied to the plasma chamber above a bias potential used to generate the plasma. The positive voltage bias drives the plasma potential to accelerate the ions to a desired implant energy. The accelerated ions pass through an aperture in the mask-slit and are directed toward a substrate for implantation. The mask-slit is electrically isolated from the plasma chamber and is maintained at ground potential with respect to the plasma.

20 Claims, 7 Drawing Sheets

(56) References Cited

U.S. PATENT DOCUMENTS

| | | |
|---|---|---|
| 7,767,977 B1 | 8/2010 | Godet et al. |
| 2003/0209676 A1* | 11/2003 | Loschner et al. .......... 250/492.2 |
| 2004/0222367 A1* | 11/2004 | Ichiki et al. ................... 250/251 |
| 2006/0236931 A1 | 10/2006 | Singh et al. |
| 2008/0317968 A1 | 12/2008 | Singh et al. |
| 2010/0084577 A1* | 4/2010 | Hatem et al. ............... 250/492.3 |
| 2010/0084581 A1* | 4/2010 | Benveniste et al. ...... 250/492.21 |
| 2010/0323508 A1 | 12/2010 | Adibi et al. |
| 2011/0124186 A1 | 5/2011 | Renau et al. |
| 2011/0180225 A1 | 7/2011 | Cao et al. |
| 2011/0223546 A1 | 9/2011 | Godet et al. |

OTHER PUBLICATIONS

Kim, Chang-Koo, et al., Plasma Molding Over Surface Topography: Energy and Angular Distribution of Ions Extracted out of Large Holes, Journal of Applied Physics, Mar. 1, 2002, pp. 2594-2603, vol. 91, No. 5, American Institute of Physics.

Stamate, E., et al., Discrete Focusing Effect of Positive Ions by a Plasma-Sheath Lens, Physical Review, 2005, pp. 036407-1 to 036407-7, vol. 72, Issue 3, The American Physical Society.

* cited by examiner

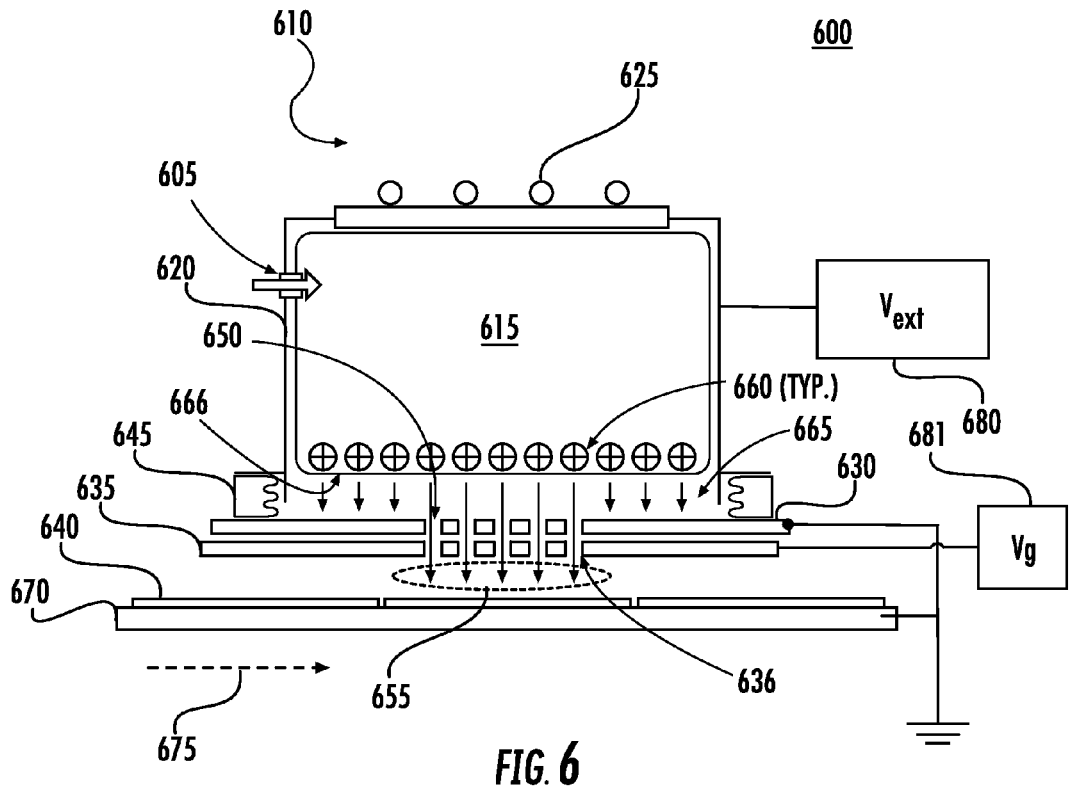
FIG. 6
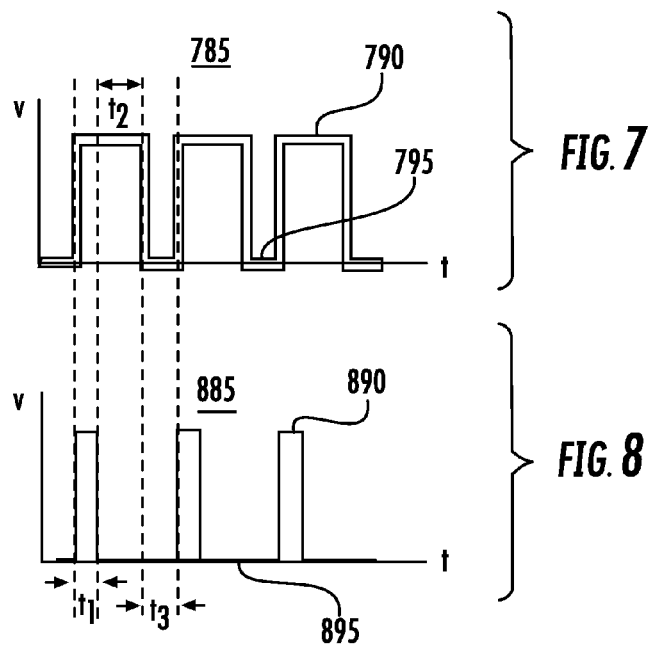
FIG. 7
FIG. 8

PLASMA POTENTIAL MODULATED ION IMPLANTATION SYSTEM

BACKGROUND

This invention relates generally to the implantation of substrates. More particularly, the present invention relates to a modulated plasma potential ion implantation system used for the fabrication of solar cells and flat panel devices.

Ion implantation is a standard technique for introducing property-altering impurities into substrates. A desired impurity material is ionized in an ion source, the ions are accelerated to form an ion beam of prescribed energy, and the ion beam is directed at the surface of the substrate. The energetic ions in the beam penetrate into the sub-surface of the substrate material and are embedded into the crystalline lattice of the substrate material to form a region of desired conductivity or material property.

Localized or selective doping or localized or selective material modification may be required for some implants. For example, fabrication of solar cell devices and/or manufacturing of flat panel devices present examples in which high dose implantation and selective doping of local areas is desirable. These high dose implantation applications require relatively high-throughput to provide an alternative to competitive fabrication techniques and systems and to contribute to the lowest cost-of-ownership for an ion implantation system. However, high-volume production for implant applications for these devices confronts significant challenges due, in part, to "glitching" in the extraction region. Generally, "glitching" refers to the interruption in beam current of an ion beam incident on a surface of a substrate. More particularly, glitching is a sudden transient in the beam current that may adversely affect dose uniformity of implant species on a target substrate.

Certain ion implantation systems used for the manufacture of solar cells suffer from a lack of suppression in the extraction region where plasma in the source chamber is coupled with the ions incident on the surface of a substrate. This may cause source instability, glitching and beam current drift. To correct for these challenges, some ion implantation systems utilize various extraction electrode configurations including, for example, a suppression electrode, a focus electrode and a ground electrode to control the extracted beam quality and to suppress unwanted glitching. Although adding these components may mitigate these challenges, it also adds to system complexity and adversely affects cost of ownership of these implanters used for high-volume production. Accordingly, there is a need in the art for an improved implantation of workpieces and, more particularly, to an improved method and apparatus for implantation of substrates while avoiding ion beam glitching.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Various embodiments are generally directed to ion implantation systems. Some embodiments are particular directed to an ion implantation system arranged to modulate a plasma potential within a chamber to accelerate ions in the plasma for implantation in a substrate. In one embodiment, a plasma chamber is operable to produce a plasma and an electrically conductive mask-slit is disposed near a first end of the plasma chamber and electrically isolated from the plasma chamber. The mask-slit includes an aperture configured to allow the accelerated ions from the plasma to pass therethrough toward the substrate for implantation therein.

In one embodiment, for example, a plasma source is used to generate a plasma within a plasma chamber. An extraction voltage is applied to the plasma chamber to accelerate ions within the plasma to a desired implant energy for implantation into a workpiece. The plasma chamber is electrically isolated from a mask-slit disposed between the plasma chamber and the workpiece. The extraction voltage applied to the plasma chamber is more positive than the potential of the mask-slit and the workpiece which may be at ground potential. The accelerated ions pass through an aperture in the mask-slit and directed toward the workpiece for implantation therein. Other embodiments are described and claimed.

BRIEF DESCRIPTION OF THE DRAWINGS

FIG. 6 is a schematic cross sectional view of an ion implantation system utilizing a beam gate.

FIG. 7 illustrates an exemplary bias voltage $V_{ext}$ pulse train utilized by the implantation system of FIG. 6.

FIG. 8 illustrates an exemplary beam gate voltage signal (Vg) pulse train utilized by the implantation system of FIG. 6.

DETAILED DESCRIPTION

Embodiments of a system and method are described herein in connection with implantation of workpieces or substrates. In various embodiments, this system can be used with, for example, solar cell substrates, semiconductor substrates, flat panels, and substrates comprising insulator material. The invention is not limited to the specific embodiments described below.

In various embodiments, an ion implantation system includes a plasma source, a mask-slit, and a plasma chamber. The plasma source may be an RF plasma source configured to generate a plasma within the plasma chamber in response to the introduction of a gas therein. In various embodiments, a bias is applied to the plasma chamber that is more positive than the potential of a mask-slit disposed between a mask-slit and the plasma chamber. The bias applied to the plasma chamber with respect to the mask-slit accelerates ions to a desired implant energy. The accelerated ions traverse a plasma sheath within the chamber, pass through an aperture in the mask-slit and are directed toward a substrate or workpiece for implantation. In some embodiments, the mask-slit may be electrically conductive and electrically isolated from the plasma chamber. The mask-slit and the workpiece or substrate may be kept at a lower potential with respect to the plasma. In addition, the portion of the mask-slit proximate the aperture may be curved in order to further control the trajectory of the ions extracted from the chamber and directed toward the workpiece or substrate. In this manner, the angle of the ion beam defined by the accelerated ions in response to the modulated plasma potential may be controlled by modifying the geometry of the mask-slit.

In various embodiments, a workpiece may be implanted at various implant energies based on the modulated plasma potential. The plasma chamber may be maintained at a uniform high pressure with respect to the region between the mask-slit and the workpiece or substrate. In this manner, the high voltage stress region is inside the plasma chamber where the pressure is uniform which is decoupled from the pressure gradient located in the area defined between the mask-slit and the workpiece or substrate. This contributes to stable plasma operation. In addition, since the mask-slit is electrically separated from the plasma through the sheath it undergoes ion bombardment from the accelerated ions. This provides a means for self cleaning of the mask-slit disposed between the plasma chamber and the workpiece or substrate.

Figure 1:
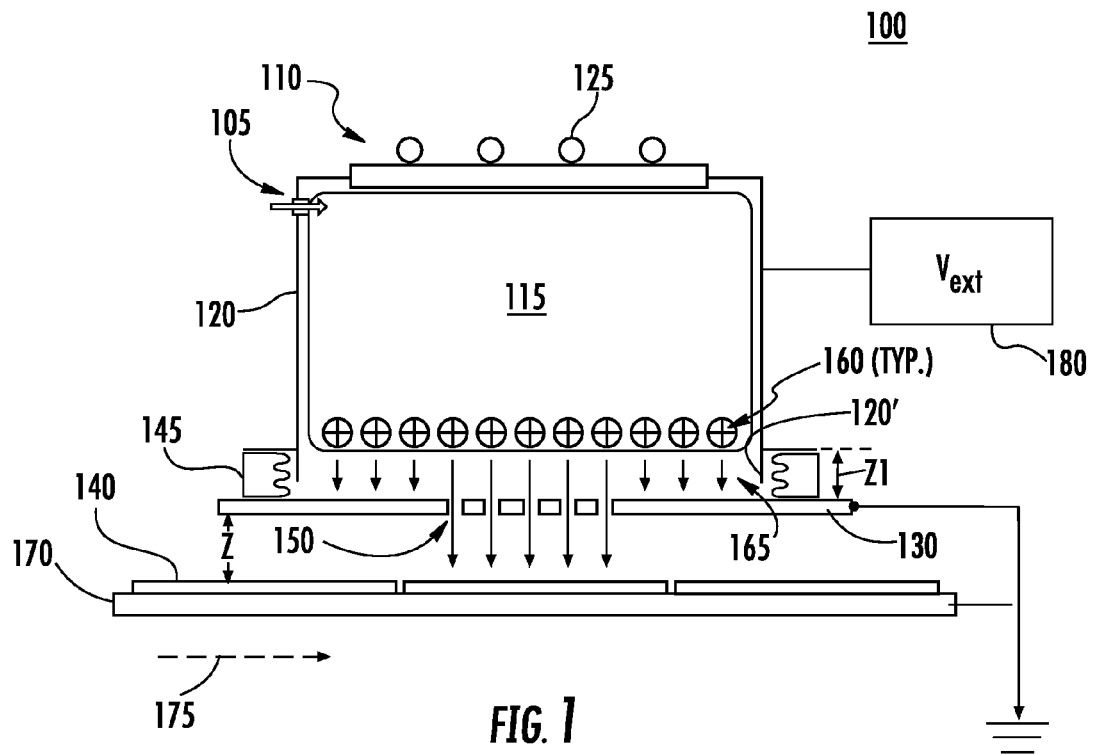
FIG. 1 illustrates a schematic cross sectional view of an ion implantation processing system.

FIG. 1 illustrates a schematic cross sectional view of an ion implantation processing system 100 including a plasma source 110, a plasma chamber 120, and a mask-slit 130. Plasma 115 is generated within plasma chamber 120 in response to plasma source 110 and the introduction of a gas 105 supplied to plasma chamber 120. In various embodiments, the plasma source 110 may be an RF plasma source, inductively-coupled plasma (ICP) source, or other plasma source known to those skilled in the art. However, in the exemplary embodiment shown in FIG. 1 the plasma source 110 may be an RF plasma source that includes RF antenna 125. The applied RF signal generated by the plasma source 110 may be pulsed or CW to generate the plasma 115 within chamber 120. The mask-slit 130 is disposed at a first end of the chamber 120 between the plasma chamber 120 and substrates 140. The mask-slit 130 may be made from an electrically conductive material and may be electrically isolated from plasma chamber 120 using insulated spacers 145. The mask-slit 130 may include a plurality of apertures 150, through which accelerated ions 160 are extracted from chamber 120 toward substrate (or workpiece) 140 for implantation therein as described in more detail below.

The insulating spacers 145 may be made from a material that can withstand high voltage stress and high temperature operating conditions such as, for example, alumina ($Al_2O_3$), quartz, boron nitride (BN), aluminum nitride (AlN), etc. Each of the insulating spacers 145 has a height Z1 which may be in the range of, for example, 2-20 cm and possibly more depending on the desired implant energy of the accelerated ions 160. In an exemplary configuration, height Z1 may preferably be in the range of 2-3 cm. In addition, the walls of chamber 120 may include extension portions 120' that extend toward mask-slit 130 a distance which protects the insulating spacers 145 from sputter deposition associated with plasma 115. The minimum height Z1 of insulating spacers 145 is defined between the end of extension portions 120' and mask slit 130.

The ions 160 may be, for example, a p-type dopant, an n-type dopant, or other species known to those skilled in the art based on the gas 105 introduced into the plasma chamber 120. The mask-slit 130 and the substrates 140 are at a lower potential than the plasma 115 and may be electrically connected to ground potential with respect to the plasma potential (Vp). The mask-slit 130 may be separated from substrates 140 by a distance "Z". Substrates 140 may be solar cells or other devices arranged on a platen 170 which may use electrostatic clamping, mechanical clamping, or a combination of electrostatic and mechanical clamping to retain the substrates 140 in position. As used herein, substrate 140 may refer to substrates 140 disposed on platen 170 and displaced in the direction indicated by arrow 175. In this manner, a particular substrate 140 undergoes ion implantation utilizing apparatus 100 for a defined period and is displaced in the direction indicated by arrow 175 and another substrate 140 is aligned with aperture 150 to undergo implantation and the process continues for high throughput applications. The substrates may be displaced in the direction indicated by arrow 175 by platen 170 in a continuous manner which provides blanket implantation to the substrates 140. Alternatively, the substrates 140 may be displaced in the direction indicated by arrow 175 by platen 170 in a stepwise fashion to provide, for example, selective emitter implantation. In addition, the mask-slit 130 may have alternative aperture 150 configurations to provide for various implantation geometries as discussed below.

Figure 1A:
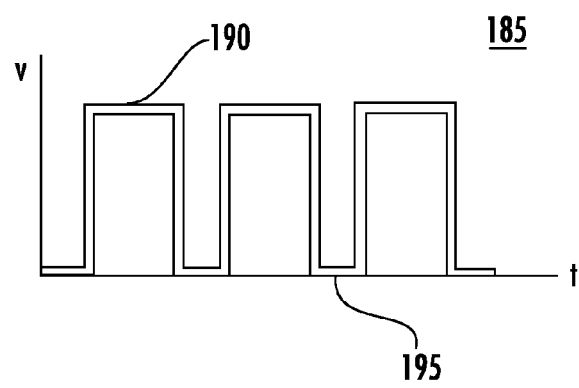
FIG. 1A illustrates an exemplary voltage pulse train utilized by the implantation system of FIG. 1.

A power source 180 is electrically connected to plasma chamber 120 and is configured to apply a bias voltage $V_{ext}$ ($V_{ext}$ may also be termed the "extraction voltage") indicated by exemplary pulse train 185 shown in FIG. 1A to drive the plasma potential (Vp) to a desired extraction energy level. The power source 180 positively biases the walls of chamber 120. Since the mask-slit 130 and substrates 140 are at ground potential, the plasma potential Vp is positively biased with respect thereto. An exemplary pulse train 185 may be used to drive the plasma potential Vp within chamber 120 to a desired potential. In particular, voltage pulse train 185 includes "ON" portions 190 in which a positive bias is supplied to the walls of plasma chamber 120 and "OFF" portions 195 in which the bias voltage is essentially at 0 v. During the pulse OFF portions 195, the plasma potential Vp remains at a typical plasma potential (e.g. 10 to 50V). This typical plasma potential Vp during the OFF portions 195 is insufficient to drive the plasma potential to the desired extraction potential and therefore the ions in the plasma do not have enough energy to implant into substrate 140. However, during the pulse ON portions 190, the positive bias applied to the plasma chamber by power source 180 drives the plasma potential Vp above the bias voltage applied using plasma source 110. This increase in plasma potential Vp accelerates ions 160 to a desired implant energy. The accelerated ions cross plasma sheath 165 defined between plasma 115 and mask-slit 130 and implant into substrate 140.

The type of ions 160 generated in plasma 115 may be controlled by the type of gas introduced into plasma chamber 120. In addition, the implant energy and consequently the depth of implantation into substrates 140 may be controlled by the duration of pulses applied by power source 180 as well as the implant energy of the ions 160. In the exemplary pulse train 185, the duty cycle of ON portions 190 may be greater than 50% and OFF portions 195 may be less than 50%. Thus, the bias voltage applied to plasma chamber 120 may constitute a series of square wave pulses consisting of a series of high positive voltage levels 190 and a series of low or 0V portions 195. The ability to provide an increase in duty cycles provides increased thorough-put for the ion implantation system 100. In some embodiments, for example, the extraction voltage $V_{ext}$ may be applied in DC form, such that the duty cycle of ON portions is 100%.

The shape of mask-slit 130 controls the trajectory of the accelerated ions 160 toward substrates 140. In the exemplary embodiment shown in FIG. 1, the area proximate the apertures 150 of mask-slit 130 is parallel to the substrates 140. This produces a parallel beam from plasma chamber 120 toward substrates 140 via apertures 150 of mask-slit 130. Although neutrals present in plasma 115 may deposit on mask-slit 130, the accelerated ions generated during the modulated plasma potential ON portions 190 may reduce and/or eliminate deposition and flaking formations present in the extraction region defined by the surface of the mask-slit 130 facing plasma chamber 120. This is due to the fact that some portion of the accelerated ions 160 bombard the surface of the mask-slit 130 proximate the plasma chamber 120. The mask-slit 130 replaces a traditional electrode configuration conventionally used for ion extraction. For example, a traditional electrode configuration may include an extraction electrode, suppression electrode and ground electrode. In these traditional configurations, the extraction electrode is positively biased with respect to ground and extracts accelerated ions toward a target substrate by application of a DC or pulsed potential applied to the electrode. The suppression electrode is negatively biased with respect to both the extraction and ground electrodes and is used to suppress electrons that backscatter from the surface of the target substrate. The ground electrode, which is at ground potential, defines the ions extracted from the source into a desired beam. In contrast, the present disclosure utilizes mask-slit 130 together with substrates 140, both biased at ground potential, and modulating the plasma potential Vp more positive than the mask slit in order to obtain the same effect of the previous electrode configurations, but without the complexity of additional components (e.g. electrodes within system 100. In addition, ions 160 that are not aligned with apertures 150 bombard mask-slit 130 which reduce or eliminate deposition and flaking formations on the surface of the mask-slit 130 facing plasma 115. This minimizes maintenance and system downtime to replace or clean mask-slit 130. Moreover, since the mask slit 130 is at ground potential, the deleterious effects of secondary electrons resulting from ions implanting in the substrate 140 is obviated.

Figure 2:
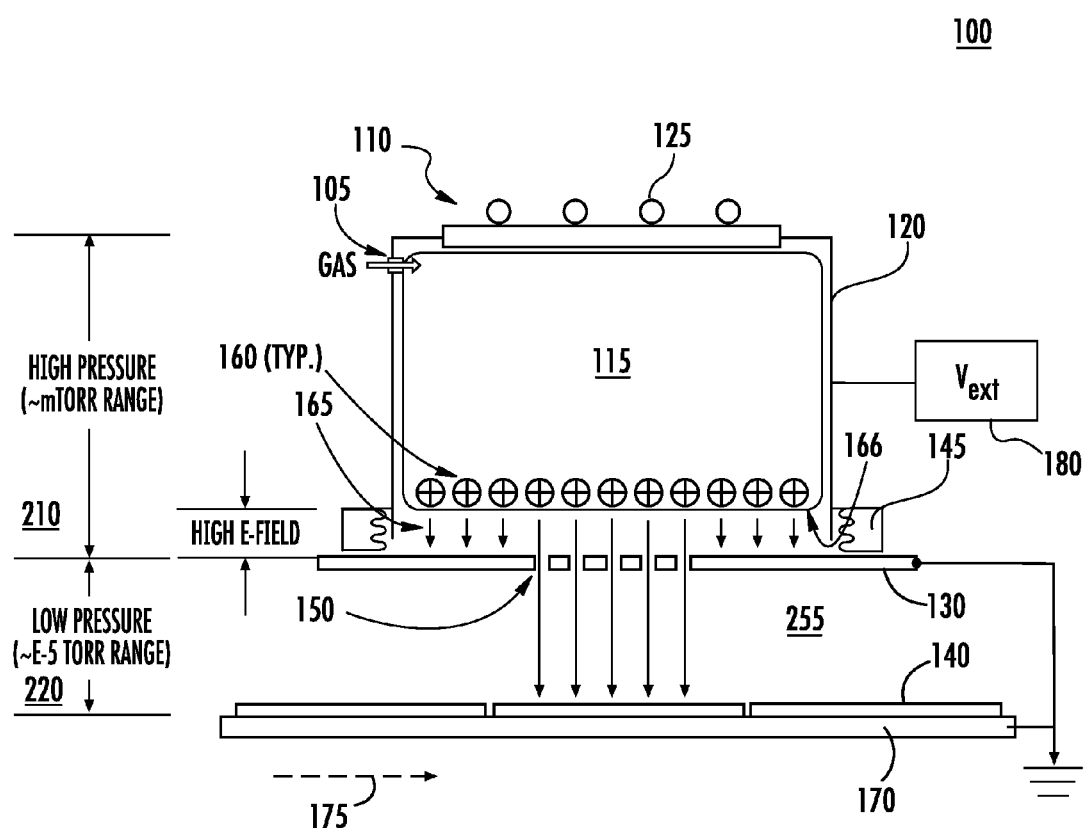
FIG. 2 illustrates a schematic cross sectional view of an ion implantation processing system.

FIG. 2 illustrates the ion implantation system 100 shown in FIG. 1. As described above, voltage source 180 is configured to apply a bias voltage to drive the plasma potential (Vp) to a desired extraction potential with respect to the mask-slit 130 and substrate 140. As noted above, the bias voltage may be supplied by the exemplary pulse train 185 shown in FIG. 1A. The ON portions 190 of voltage pulse 185 applied to the walls of plasma chamber 120 may be at a relatively high voltage in order to increase the plasma potential sufficiently to accelerate the ions in plasma 115 to a desired implant energy (e.g. 10 keV). Therefore, the high voltage (HV) stress region is inside the plasma chamber. The plasma chamber 120 is maintained at a high pressure, for example in the ~mTorr range as indicated at reference 210. The plasma sheath region 165 defined between the plasma boundary 166 and mask-slit 130 has a high electric field. Conversely, since both the mask-slit 130 and substrates 140 are maintained at ground potential, the electrical field in the area 255 defined therebetween is essentially zero (i.e. field-free region). In addition, the region 255 is maintained at a relatively low pressure, in the ~E-5 Torr range for example as indicated at reference 220. Thus, the pressure gradient is defined where the pressure changes from a relatively high pressure within plasma chamber 120 to a relatively low pressure region 255 between the mask-slit 130 and the substrates 140. This pressure gradient is down-stream of mask-slit 130 where the electric field is essentially zero (i.e. both mask-slit 130 and substrates 140 are at ground potential). Since the pressure gradient is down-stream of mask-slit 130, plasma chamber and consequently the plasma generated within the plasma chamber 120 are not exposed to this pressure gradient. In this manner, the HV stress region of plasma formation is decoupled from the pressure gradient region (255) through which the extracted ions are focused toward substrates 140.

As noted above, in certain prior systems a coupling may occur between the plasma in the source chamber and the target substrate which causes source instability, extraction glitching and potentially beam current drift. As previously described, glitching is an interruption in beam current of the extracted ion beam. In contrast, the system 100 of the present disclosure decouples the plasma 115 generated in the plasma chamber in the HV stress region of plasma formation from the pressure gradient region (155) through which the extracted ions are focused toward substrates 140. This provides for more stable system operation than previously considered and the deleterious effects of glitching are reduced. Thus, plasma operation may be stable at a given uniform pressure within chamber 120. Moreover, since the plasma is not exposed to this pressure gradient, operating parameters within the plasma chamber 120 such as, for example, electron density, electron temperature, etc., may be independently controlled by modulation of the plasma potential Vp which is distinct from consideration of the extraction parameters of ions from plasma 115.

Figure 3:
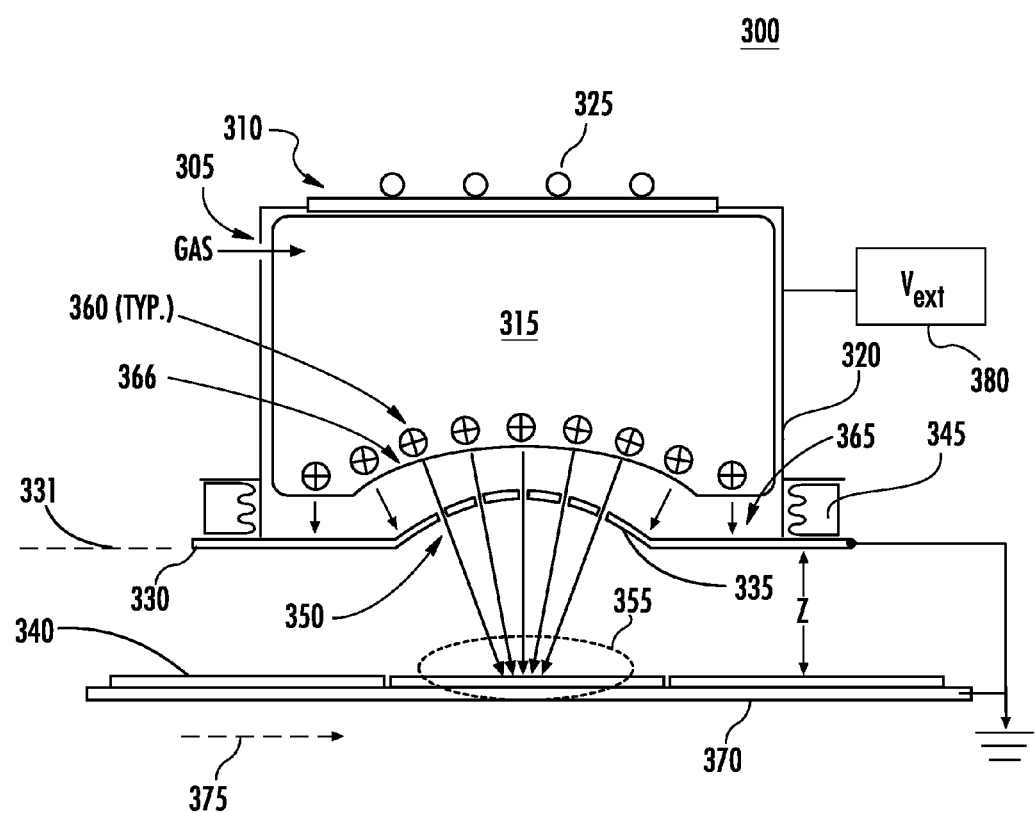
FIG. 3 illustrates a schematic cross sectional view of an ion implantation processing system.

FIG. 3 is a schematic cross sectional view of an ion implantation system 300 utilizing a mask-slit 330 with a concaved portion 335. The geometry of mask-slit 330 alters or modifies the plasma boundary 366 between plasma 615 about plasma sheath region 365 and may be utilized depending on the type of implantation desired. In particular, the concaved portion 635 alters or modifies the plasma boundary 666 between plasma 615 and plasma sheath 665. Mask-slit 330 includes a plurality of apertures 350 spaced along concave portion 335 through which accelerated ions 360 are extracted to form ion beam 355. The concaved profile portion 335 is illustrated as generally having a radius of curvature aligned with a center of the mask-slit 330. However, alternative configurations may also be employed. The apertures 350 are shown as being equally spaced along concave portion 335 of mask-slit 330; however the embodiments are not limited in this respect. The plurality of apertures 350 allow accelerated ions 360 within plasma 315 having various trajectories to be selectively extracted from plasma chamber 320 to form a more focused ion beam 355 as compared to the beam shown in FIG. 1. In addition, the concave portion 335 of mask-slit 330 may be flexible in order to change the shape thereof to control the divergence or convergence of ion beam 355.

The geometry of mask-slit 330 may be used to focus the accelerated ions 360 within plasma 315 which are aligned with the one or more apertures 350 toward substrates 340. The accelerated ions that do not align with the apertures 350 of the concaved portion 335 are prevented from passing through the mask-slit 330 toward substrates 340. As described above, the ions within plasma 315 are accelerated to a desired implant energy by increasing the plasma potential Vp based on the positive bias supplied by power source 380 and applied to the walls of plasma chamber 320. The mask-slit 330 is maintained at ground potential. The plasma sheath region 365 and plasma boundary 366 correspond to the shape of the concaved portion 335 since the electric field within the plasma sheath controls the shape of the plasma boundary 366.

By modulating the plasma potential Vp based on the signal applied to the walls of chamber 320 and by modifying the geometry of the portion of mask-slit 330 associated with the apertures 350, the trajectory of the accelerated ions 360 and consequently the focusing of the ion beam 355 extracted from plasma chamber 320 via apertures 350 may be controlled. As shown in FIG. 3, the arrangement of apertures 350 about the radius of concaved portion 335 of mask-slit 330 only allows accelerated ions having trajectories corresponding to these apertures to pass through the mask-slit 330 toward substrate 340. The ions 360 extracted through the apertures 350 of mask-slit 330 may impinge on substrate 340 over a range of angles in which the ion beam as a whole may focus to a smaller width as indicated by area 345. The shape of the mask-slit 330 modifies the electric field within the plasma sheath 365 to control the shape of the boundary 366 defined between the plasma 315 and the plasma sheath 365. When the plasma potential Vp is driven positive using a DC or pulsed bias, for example, the ions 360 traverse across plasma sheath 365 through the apertures 350 of mask-slit 330 and impinge an upper surface of substrate 340. Substrates 340 are positioned on platen 370 a distance 'Z' away from mask-slit 330. This distance "Z" and the shape of the concaved portion 335 of mask-slit 330 may be controlled to prevent the trajectories of the extracted ions from crossing before impinging an upper surface of substrate 340. Moreover, since ions 360 have like electric charge and tend to repel each other, the placement of apertures 350 about concaved portion 335 and the distance Z may be optimized to form ion beam 355 incident on substrates 340 with limited beam blow-up.

Figure 4:
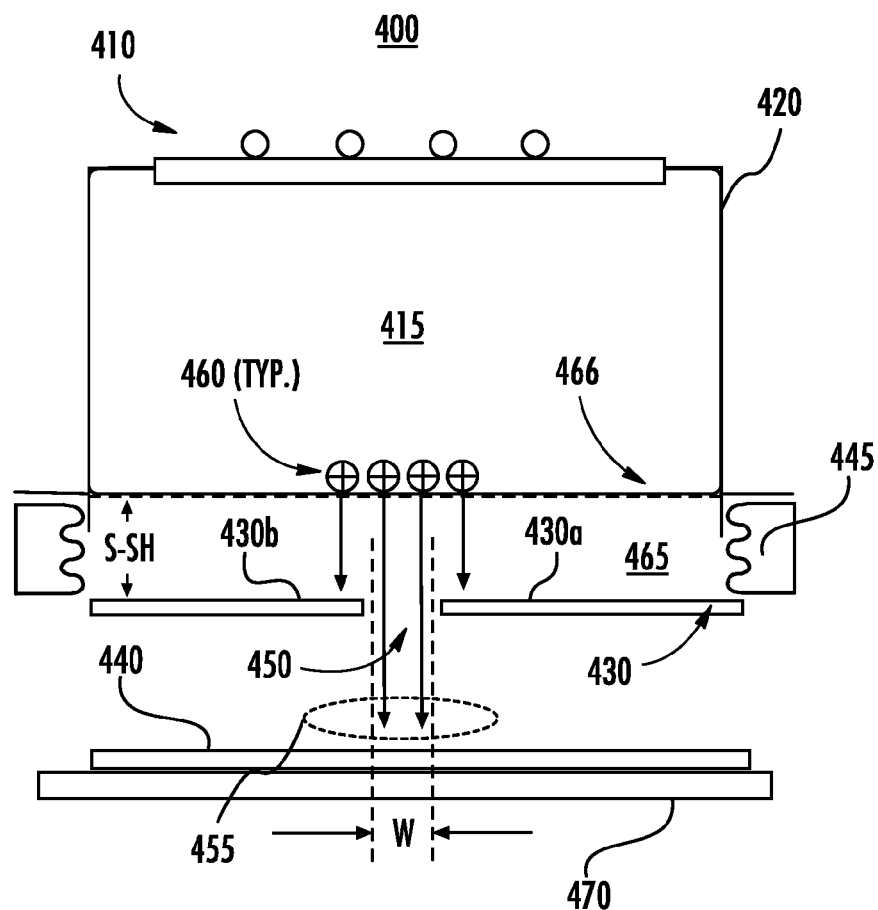
FIG. 4 illustrates a schematic cross sectional view of an ion implantation processing system.

FIG. 4 is a schematic cross sectional view of an ion implantation system 400 to illustrate an exemplary mask-slit configuration. In particular, the ion implantation system 400 utilizes a mask-slit 430 with a relatively wide single aperture 450. The mask-slit 430 is arranged parallel to substrates 440 to provide a parallel ion beam 455 for implantation into substrates 440. Generally, the control of ion beam 455 generated by implantation system 400 is achieved through the shape of the plasma boundary 466 since it is this shape in combination with the mask-slit 430 and associated aperture 450 that determines which of the accelerated ions 460 are aligned with the aperture 450 and directed toward substrate 440. The shape of the plasma boundary 466 may be adjusted by modifying the shape of the mask-slit 430, adjusting the potential between the plasma 415 and the mask-slit 430, the electron temperature of the plasma 415, the amount of gas used to generate the plasma 415, the density of the plasma, the particular ion species being used and the current being extracted.

Mask-slit 430 may be a unitary electrically conductive plate (e.g. graphite, silicon or silicon carbide) having an aperture 450 defining a gap having a width "W". Alternatively, the mask-slit 430 may be defined by separate portions 430a and 430b adjacently disposed to define the gap having width "W". The geometry of mask-slit 430 may be used to direct the accelerated ions 460 from plasma 415 which are aligned with aperture 450 toward substrates 440. The accelerated ions 460 that do not align with the aperture 450 are prevented from passing through mask-slit 430. The relatively wide single aperture 450 of mask-slit 430 may be used for wide or blanket implantation of substrates 440.

As described above, the ions within plasma 415 are accelerated to a desired implant energy by increasing the plasma potential Vp based on the positive bias $V_{ext}$ supplied by a power source (such as power source 380 shown in FIG. 3) applied to the walls of plasma chamber 420. The mask-slit 430 is maintained at ground potential and is electrically isolated from the walls of plasma chamber 420 by insulated spacers 445. A plasma sheath region 465 is formed between the plasma 415 and mask-slit 430. The plasma sheath region 465 and consequently plasma boundary 466 correspond to the shape of mask-slit 430 proximate the aperture 450 based on the electric field within the plasma sheath 465. The ions 460 extracted from plasma 415 are the ions that are aligned with aperture 450 of mask-slit 430. These ions form a parallel ion beam 455 for implantation into substrate 440. In accordance with various embodiments, the implantation of ions 460 may be controlled by varying process conditions including plasma potential Vp, duty cycle of the bias potential applied to walls of plasma chamber 420, and the configuration of mask-slit 430. Moreover, the application of the bias potential to the walls of the plasma chamber 420 may determine the ion dose of the ion beam 455 and the aperture 450 of mask-slit 430 may control the parallelism of the ion beam with respect to the substrate 440. Those skilled in art will recognize that the shape of the mask slit 430 controls the parallelism of the ion beam with respect to the substrate providing that the width W of the mask slit aperture 450 is small as compared to the plasma-sheath thickness S-sh. For example, when the width W is much less than the plasma sheath thickness S-sh (W<<S-sh), then an essentially planar sheath is obtained and the resulting beam is directional. However, if the width W of mask-slit aperture 450 is large as compared to the plasma-sheath thickness S-sh where W>>S-sh then the plasma boundary may be convex and plasma may leak through the aperture thereby resulting in a divergent beam. For example, the sheath thickness S-sh for an RF plasma at 1-2 mTorr with a plasma density of approximately $5*10^{10}$ cm$^{-3}$ of Argon may be about 7 mm. Furthermore, when the width W of the mask-slit is approximately 10-15 mm and 3 keV Argon is extracted through mask slit 430, then the plasma may leak through the aperture 450. Since the plasma leaks through aperture 450 of mask slit 430, the plasma sheath interface which is defined by the plasma sheath and mask slit 430 may be relatively flat near the center of the aperture 450 and convex at the edges so that the extracted ion beam 455 is parallel in the center ion and diverging at the edges.

Figure 5:
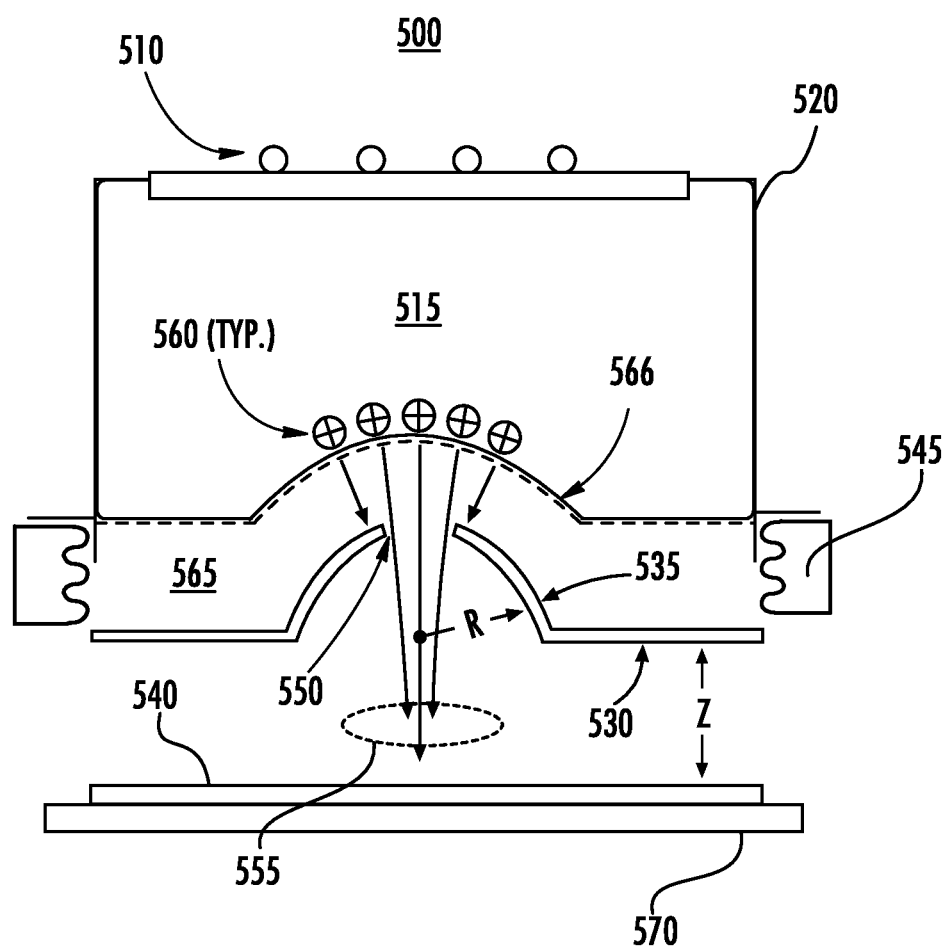
FIG. 5 illustrates a schematic cross sectional view of an ion implantation processing system.

FIG. 5 is a schematic cross sectional view of an ion implantation system 500 to illustrate an alternative configuration of an exemplary mask-slit. In particular, ion implantation system 500 utilizes a mask-slit 530 having a concave portion 535 and a single aperture 550 through which accelerated ions are directed toward substrate 540. The concave portion 535 may have a radius of curvature "R" used to modify plasma boundary 566 and control the direction of extracted ions toward substrates 540. The mask-slit is spaced apart from substrates 540 a distance "Z" taking into account the radius of curvature of concave portion 535. Aperture 550 may be approximately centered within the concaved portion 535; however the embodiments are not limited in this respect. The concaved portion 535 alters or modifies the plasma boundary 566 between plasma 515 and the plasma sheath 565. The ions within plasma 515 are accelerated to a desired implant energy by increasing the plasma potential Vp based on the modulated positive bias $V_{ext}$ supplied by a power source applied to the walls of plasma chamber 520. The mask-slit 530 is maintained at a potential lower than the plasma potential, which may be a ground potential, and is electrically isolated from the walls of plasma chamber 520 by insulated spacers 545. Thus, the plasma sheath region 565 is defined between the plasma 515 and mask-slit 530. The plasma boundary 566 corresponds to the shape of the mask-slit 530 proximate aperture 550 based on the electric field within the plasma sheath 565.

The ions 560 extracted from plasma 515 are ions that have trajectories aligned with aperture 550 of mask-slit 530. The ions that are not aligned with the aperture 550 are not at the desired implant angle and bombard mask slit 530. The ions not aligned with aperture 550 are prevented from striking substrates 540 by mask-slit 530. The ions extracted from plasma 515 and aligned with aperture 550 of mask-slit 530 form a focused ion beam 555 for implantation into substrate 540 in response to the modulated plasma potential Vp. The ion beam 555 exiting aperture 550 is divergent due to the fact that ions 560 have like electric charge and have randomly oriented velocities due to thermal motion within plasma 515. Although mask-slit 535 includes concaved portion 535, the ions that comprise ion beam 555 try to repel each other in more of a convex shape. Thus, careful control of the acceleration of ions 560 within plasma 515 based on the modulated plasma potential, the shape of the concaved portion 536 of mask-slit 530, the distance "Z" the substrates 540 are from mask-slit 530 and the design of the aperture 550 contribute to minimizing he loss of ions incident on substrates 540.

In an alternative embodiment, an additional mask-slit (not shown), similar to mask slit 530, may be disposed between mask-slit 530 and substrates 540. This additional mask-slit may also include apertures aligned with apertures 550 and may be configured to focus the accelerated ions 660 more narrowly into ion beam 555 toward substrates 540. This configuration employing a mask-slit in addition to mask-slit 530 may be used for narrow line or IBC style dotted implants. In this alternative embodiment, the additional mask-slit may be set at ground potential, the same as the mask-slit 530 and substrates 540. Accordingly, a "field-free region" is still maintained for stable operation.

FIG. 6 is a schematic cross sectional view of an ion implantation system 600 utilizing a beam gate 635. Generally, ion implantation system 600 includes a plasma source 610, a plasma chamber 620, a mask-slit 630 and a beam gate 635 disposed between the mask-slit 630 and substrates 640. Plasma 615 is generated within plasma chamber 620 in response to plasma source 610 and the introduction of a gas 605 supplied to plasma chamber 620. In various embodiments, the plasma source 610 may be a plasma source known to those skilled in the art; however, in the exemplary embodiment shown in FIG. 6 the plasma source 610 may be an RF plasma source that includes RF antenna 625. The applied RF signal generated by the plasma source 610 may be pulsed or CW to generate the plasma 615. The mask-slit 630 and beam gate 635 are disposed at a first end of the plasma chamber 620 and may be made from an electrically conductive material. The mask-slit is electrically isolated from plasma chamber 620 using insulated spacers 645 and beam gate 635 may be independently biased using power source 681. The mask-slit 630 may include a plurality of apertures 650 which are aligned with apertures 636 of beam gate 635. The ions 660 extracted from plasma 615 are ions that are aligned with apertures 650 of mask-slit 630 and apertures 636 of beam gate 635. The ions not aligned with apertures 650 are prevented from passing through apertures 636 of beam gate 635 by mask-slit 630. The ions extracted from plasma 615 aligned with apertures 650 of mask-slit 630 and apertures 636 of beam gate 635 form ion beam 655 for implantation into substrates 640.

It should be noted that alternative configurations of mask-slit 630 as illustrated, for example, in FIGS. 4 and 5 may be employed with ion implantation system 600. Likewise, alternative configurations of beam gate 635 corresponding with the shape of mask-slit 640 may also be employed.

As noted above, the beam gate 635 is disposed between mask-slit 630 and substrates 640. The beam gate is used to control the quality of the extracted ion beam 655 and achieve required energy accuracy. In particular, the ions within plasma 615 are accelerated to a desired implant energy by increasing the plasma potential Vp based on the modulated positive bias $V_{ext}$ supplied by power source 680 applied to the walls of plasma chamber 620. The plasma sheath region 665 is defined between the plasma 615 and mask-slit 630. During the initial application stage of the modulated positive bias $V_{ext}$ supplied by power source 680, the plasma sheath region 665 expands. During the initial period, certain ions 660 accelerate to the desired implant energy and certain ions 660 do not. However, ions 660 that do accelerate to the desired implant energy may not have trajectories aligned with apertures 650 (of mask-slit 630) and apertures 636 (of beam gate 635). This results in variations in beam quality, namely the energy, width, density and angle of beam 636 since the plasma potential Vp may not rise to the extraction potential instantaneously.

FIG. 7 illustrates an exemplary bias voltage $V_{ext}$ pulse train 785 supplied by power source 680 used to drive the plasma potential (Vp) of plasma 615 to a desired extraction energy level. An exemplary voltage pulse train 785 supplied by power source 680 includes "ON" portions 790 in which a positive bias is supplied to the walls of plasma chamber 620 and "OFF" portions 795 in which the bias voltage is essentially at 0 V. During the pulse OFF portions 795, the plasma potential Vp remains at a typical plasma potential, which may be, for example, +10 to +50V. During the initial application stage of bias voltage $V_{ext}$ indicated by time period $t_1$, a gate voltage Vg is applied to beam gate 635 using power source 681. An exemplary beam gate voltage signal (Vg) illustrated by pulse train 885 in FIG. 8 may comprise "ON" portions 890 and "OFF" portions 895. During the pulse ON portions 890, the beam gate voltage Vg is applied to beam gate 635. The pulse ON portions 890 correspond with the pulse ON portions 790 of exemplary pulse train 785 during time period $t_1$ such that the duration of ON portion 890 coincides with the initial portion of pulse ON period in 790. The pulse OFF portions 895 correspond to time period $t_2$ of pulse train 885 as well as a period of the ON portions 790 of bias voltage signal Vext during time period $t_2$. In other words, the ON portions 890 of gate voltage Vg correspond to time period $t_1$ and the OFF portions 895 correspond to time period $t_2$ plus time period $t_3$. Moreover, the ON portions 790 of pulse train 785 of bias voltage $V_{ext}$ corresponds to time period $t_1$ plus time period $t_2$ and the OFF portions 795 corresponds to time period $t_3$. Thus, during time period $t_2$, the extracted ions 660 are implanted into substrate 640. By applying the gate voltage Vg at the initial stage of the bias voltage $V_{ext}$ during time period $t_1$, the beam quality may be controlled while the plasma sheath 665 expands. This may increase the quality of ion beam 655 incident on substrate 640 in that the implanting energy, width, parallelism and angle of the ions 660 can be maintained during the implant time period $t_2$.

Included herein is a flow chart representative of an exemplary process for utilizing the ion implantation systems disclosed herein. While, for purposes of simplicity of explanation, the one or more processes shown herein, for example, in the form of a flow chart or logic flow are shown and described as a series of acts, it is to be understood and appreciated that the processes are not limited by the order of acts as some acts may, in accordance therewith, occur in a different order and/or concurrently with other acts from that shown and described herein. For example, those skilled in the art will understand and appreciate that a methodology could alternatively be represented as a series of interrelated steps. Moreover, not all steps illustrated in a methodology may be required for a novel implementation.

Figure 9:
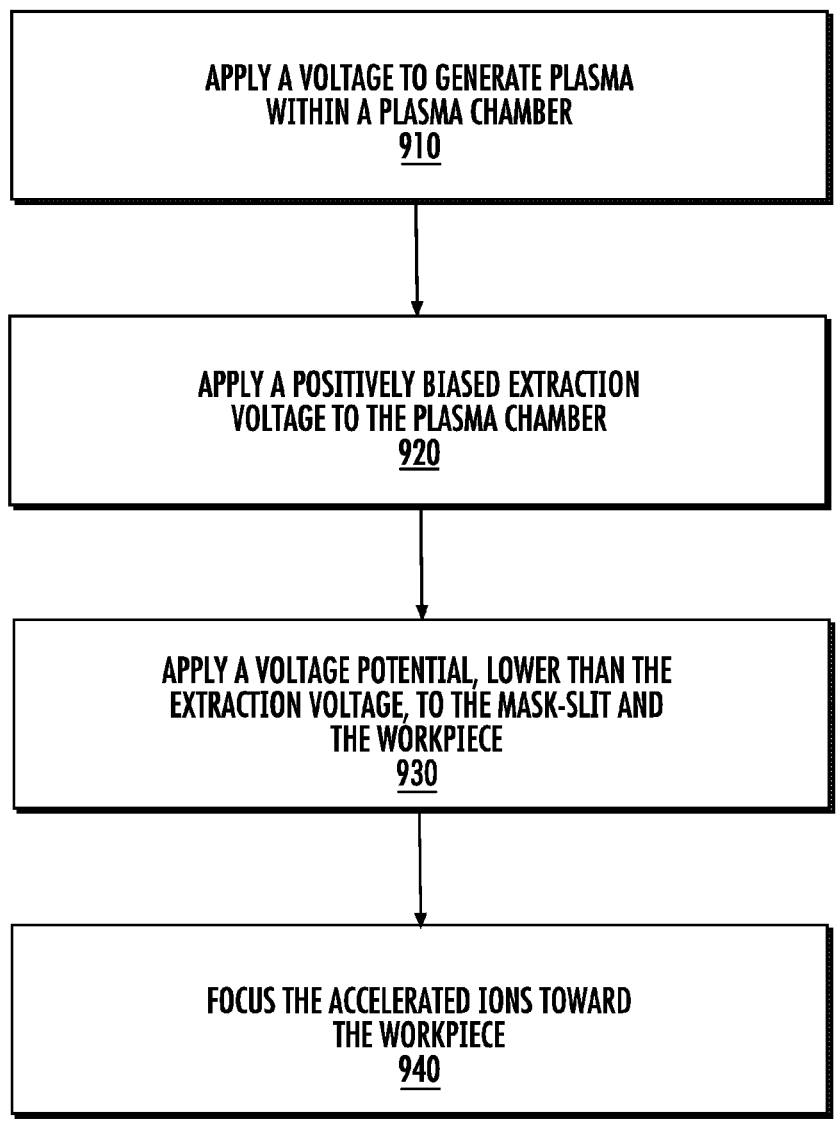
FIG. 9 illustrates an embodiment of a logic flow for the operation of an ion implantation system.

FIG. 9 illustrates a logic flow 900 consistent with use of ion implantation systems disclosed herein. 8 A RF voltage may be applied to a plasma source to generate plasma within a plasma chamber at block 910. For example, in the ion implantation system 100 shown in FIG. 1, plasma 115 is generated within plasma chamber 120 in response to plasma source 110 and the introduction of a gas 105 supplied to plasma chamber 120. A positively biased voltage, which may be pulsed or DC, is applied to the plasma chamber to accelerate ions within the plasma at block 920. For example, a power source 180 is electrically connected to plasma chamber 120 and is configured to apply a pulsed bias voltage $V_{ext}$ indicated by exemplary pulse train 185 shown in FIG. 1A to drive the plasma potential (Vp) to a desired extraction energy level. A bias voltage, lower than the extraction voltage, is applied to the mask-slit and the workpiece at block 930. In some cases, the mask-slit and workpiece may be connected to ground potential. In addition, the accelerated ions are directed toward an aperture in the mask-slit during a positive portion of the positively pulsed extraction voltage. For example, the power source 180 positively biases the walls of chamber 120. Since the mask-slit 130 and substrates 140 are at a lower potential than the extraction voltage (e.g. ground potential), the plasma potential Vp is positively biased with respect thereto. A DC bias or an exemplary pulse train 185 may be used to drive the plasma potential Vp within chamber 120 to a desired potential. The accelerated ions are focused toward the workpiece for implantation therein at block 940. For example, the accelerated ions 160 aligned with apertures 150 of mask-slit 130 are extracted from the plasma chamber 120 and directed toward substrates 140 for implantation therein.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. In particular, embodiments in which various configurations of mask-slits and beam gates in order to provide a desired ion beam for implantation into a substrate are possible. Moreover, embodiments in which the plasma potential is modulated at various power levels and frequencies is also possible. In addition, embodiments are contemplated in which substrate movements can be either continuous for blanket implants or stepwise for selective emitter implantation. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An ion implantation apparatus, comprising:
    a plasma chamber operable to produce a plasma, the plasma chamber defining a set of sidewalls and an end wall; and
    an electrically conductive mask-slit disposed at a first end of the plasma chamber and electrically isolated from the plasma chamber, the mask-slit at a ground potential and positioned directly adjacent the plasma, the mask-slit further having an aperture configured to allow accelerated ions from the plasma to pass therethrough for implantation into a substrate disposed on a platen, and the mask-slit and the platen extending laterally beyond a plane defined by each of the set of sidewalls of the plasma chamber.

2. The ion implantation apparatus of claim 1 wherein the ions pass through the aperture of the mask-slit in response to a voltage bias applied to the plasma chamber.

3. The ion implantation apparatus of claim 2 wherein the voltage bias applied to the plasma chamber being configured to bias the plasma within the plasma chamber more positively than with respect to the mask-slit.

4. The ion implantation apparatus of claim 2 wherein the voltage bias applied to the plasma chamber being configured to bias the plasma within the plasma chamber more positively with respect to the mask-slit and the substrate.

5. The ion implantation apparatus of claim 1 wherein the mask slit is electrically isolated from the plasma chamber by an insulated spacer.

6. The ion implantation apparatus of claim 1, wherein the mask-slit has a curved profile proximate the aperture to control a trajectory of the ions toward the substrate.

7. The ion implantation apparatus of claim 1 wherein the aperture is a first aperture, the mask-slit having a second aperture configured to direct ions from the plasma to pass therethrough toward the substrate.

8. The ion implantation apparatus of claim 1 wherein a plasma sheath is defined between the plasma within the chamber and the mask-slit, the ions from the plasma being accelerated across the sheath through the aperture of the mask-slit when the voltage bias is applied to the plasma chamber.

9. The ion implantation apparatus of claim 8 wherein the aperture has a width, a ratio is defined between the width and a thickness of the plasma-sheath to control directionality of the beam.

10. The ion implantation apparatus of claim 1 comprising a voltage source connected to the plasma chamber configured to supply the voltage bias to the plasma chamber, wherein the voltage source is pulsed defining a duty cycle having a pulse-ON period and a pulse-OFF period, the pulse-ON period configured to apply the voltage bias to the plasma chamber.

11. The ion implantation apparatus of claim 10 wherein the aperture is a first aperture and the bias voltage is a first bias voltage, the apparatus further comprising an electrically conductive beam gate disposed between the substrate and the mask-slit, the beam gate having a second aperture aligned with the first aperture and configured to be independently biased such that the beam gate receives a second bias voltage corresponding to the pulse-ON period of the voltage bias applied to the plasma chamber.

12. The ion implantation apparatus of claim 1 wherein the plasma chamber is maintained at a first pressure and an area defined between the mask-slit and the substrate is maintained at a second pressure, the first pressure being greater than the second pressure.

13. The ion implantation apparatus of claim 1 wherein the mask-slit includes a flexible portion capable of having a curved profile proximate the aperture to control a trajectory of the ions from the plasma toward the substrate.

14. A method of implanting a workpiece in an ion implantation system, comprising:
    generating a plasma within a plasma chamber, the plasma chamber defining an end wall and a set of sidewalls;
    applying an extraction voltage to the plasma chamber to accelerate ions from the plasma towards a platen securing the workpiece;
    electrically isolating the plasma chamber from a mask-slit disposed between the plasma chamber and the workpiece, the mask-slit at a ground potential and positioned directly adjacent the plasma, and the mask-slit and the platen extending laterally beyond a plane defined by each of the set of sidewalls of the plasma chamber; and
    applying a voltage bias lower than the extraction voltage to the mask-slit and the workpiece, the accelerated ions directed toward an aperture in the mask-slit during a portion of a pulsed extraction voltage.

15. The method of claim 14 further comprising controlling a trajectory of the ions toward the workpiece by providing the mask-slit with a curved profile proximate the aperture.

16. The method of claim 14 further comprising accelerating the-ions across a sheath defined between the plasma within the plasma chamber and the mask-slit during the portion of the applied extraction voltage.

17. The method of claim 14 further comprising flexing a portion of the mask-slit proximate the aperture to control a convergence of the ions toward the workpiece.

18. The method of claim 14 further comprising flexing a portion of the mask-slit proximate the aperture to control a divergence of the ions toward the workpiece.

19. The method of claim 14 wherein the aperture is a first aperture and the extraction voltage is a first bias voltage, the method further comprising applying a second bias voltage to an electrically conductive beam gate disposed between the workpiece and the mask-slit, the electrically conductive beam gate independently biased using a power source.

20. The method of claim 19 wherein the second bias voltage is applied to the beam gate corresponding to a portion of the pulsed extraction voltage portion applied to the plasma chamber.

\* \* \* \* \*